(12) United States Patent
Kim

(10) Patent No.: US 8,709,840 B2
(45) Date of Patent: Apr. 29, 2014

(54) LIGHT-EMITTING DEVICE PACKAGE AND METHOD OF MANUFACTURING THE SAME

(75) Inventor: Hyung-kun Kim, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 98 days.

(21) Appl. No.: 13/312,237

(22) Filed: Dec. 6, 2011

(65) Prior Publication Data

US 2012/0161163 A1  Jun. 28, 2012

(30) Foreign Application Priority Data

Dec. 28, 2010 (KR) .................. 10-2010-0137227

(51) Int. Cl.
*H01L 33/00* (2010.01)

(52) U.S. Cl.
USPC ............................................ 438/26; 438/28

(58) Field of Classification Search
USPC ............................................ 438/26–28, 25
See application file for complete search history.

(56) References Cited

U.S. PATENT DOCUMENTS

| 2002/0175621 A1* | 11/2002 | Song et al. .................... 313/515 |
| 2003/0062185 A1 | 4/2003 | Hammond et al. |
| 2010/0136726 A1* | 6/2010 | Braddell et al. ................ 438/28 |
| 2011/0062482 A1* | 3/2011 | Solomensky et al. ........... 257/99 |

FOREIGN PATENT DOCUMENTS

| KR | 10-2007-0090509 A | 9/2007 |
| KR | 10-2009-0104580 A | 10/2009 |
| KR | 10-2010-0030071 A | 3/2010 |

\* cited by examiner

*Primary Examiner* — Matthew Reames
(74) *Attorney, Agent, or Firm* — McDermott Will & Emery LLP

(57) ABSTRACT

A light-emitting device package uses a metal layer as a reflective region and includes a light-emitting device chip and an electrode pad that are disposed on an insulating layer. In addition, the electrode pad and an electrode pattern of a printed circuit board are connected to each other by an electrode pattern formed of conductive ink. A method of manufacturing a light-emitting device package includes forming an insulating layer on a metal layer, and bonding a light-emitting device chip and an electrode pad on the insulating layer. The electrode pad and a printed circuit board are connected to each other by conductive ink.

9 Claims, 5 Drawing Sheets

LIGHT-EMITTING DEVICE PACKAGE AND METHOD OF MANUFACTURING THE SAME

CROSS-REFERENCE TO RELATED APPLICATIONS

This application claims the benefit of Korean Patent Application No. 10-2010-0137227, filed on Dec. 28, 2010, in the Korean Intellectual Property Office, the disclosure of which is incorporated herein in its entirety by reference.

BACKGROUND

1. Field

The present disclosure relates to light-emitting device packages and methods of manufacturing the same, and more particularly to, light-emitting device packages using a metal layer as a reflective region of light emitted from a light-emitting device chip, and methods of manufacturing the light-emitting device packages.

2. Description of the Related Art

In a semiconductor light-emitting device such as a light-emitting diode (LED), a light source is formed by recombining an electron and a hole in a p-n junction of a semiconductor so as to produce light with various colors. The semiconductor light-emitting device has a long lifetime, can be miniaturized and lightweight, and has excellent optical directivity. And, the semiconductor light-emitting device can be driven at a low voltage. In addition, the semiconductor light-emitting device is resistant to impacts and oscillation, does not require a warming time and complex driving, and can be packaged to have various shapes. Thus, the semiconductor light-emitting device may be variously used.

A printed circuit board (PCB) is a component for connecting or supporting electronic components on a printed circuit mother plate according to a circuit design of an electrical wiring. By virtue of the development of major consumers of PCBs, such as electronics, communication devices, semiconductor equipment, or industrial devices, PCBs have been increasingly used. In particular, as electronic components have been miniaturized and have been highly developed, PCB products have been also miniaturized and made lightweight, and have become more valuable. Specially, a metal core printed circuit board (MCPCB) is a PCB using a metal substrate as a core substrate, and has been increasingly used to effectively dissipate heat from light-emitting device chips.

SUMMARY

Additional aspects will be set forth in part in the description which follows and, in part, will be apparent from the description, or may be learned by practice of the presented embodiments.

According to an aspect of the present invention, a light-emitting device package includes a metal layer; an insulating layer disposed on the metal layer; a first electrode pattern disposed on an edge portion of the insulating layer; at least one light-emitting device chip disposed on the insulating layer; at least one electrode pad disposed around the at least one light-emitting device chip on the insulating layer; and a second electrode pattern disposed on the insulating layer and connecting the first electrode pattern and the at least one electrode pad to each other.

The light-emitting device package may further include a solder mask pattern disposed on an edge portion of the insulating layer and covering the first electrode pattern.

The second electrode pattern may be formed of conductive ink.

The metal layer may reflect light emitted from the at least one light-emitting device chip.

The light-emitting device package may further include a metal wire for electrically connecting the at least one light-emitting device chip and the at least one electrode pad to each other.

A plurality of light-emitting device chips may be disposed on the insulating layer, and the plurality of light-emitting device chips may share the at least one electrode pad, and are connected with the at least one electrode pad by the metal wire.

The at least one electrode pad may include a plurality of n-type electrode pads, and the second electrode pattern may include a continuous n-type electrode pattern that connects the plurality of n-type electrode pads to each other.

The at least one electrode pad may include a plurality of p-type electrode pads, and the second electrode pattern may include a continuous p-type electrode pattern that connects the plurality of p-type electrode pads to each other.

The light-emitting device package may further include a dam surrounding the at least one light-emitting device chip on the insulating layer, wherein a phosphor layer may be formed inside the dam.

The light-emitting device package may further include an optical lens disposed on the phosphor layer.

According to another aspect of the present invention, a method of manufacturing a light-emitting device package, the method including preparing a metal layer; forming an insulating layer on the metal layer; forming a first electrode pattern on an edge portion of the insulating layer; bonding at least one light-emitting device chip on the insulating layer; forming at least one electrode pad around the at least one light-emitting device chip; and forming a second electrode pattern for connecting the first electrode pattern and the at least one electrode pad to each other on the insulating layer.

The method may further include forming a solder mask pattern on an edge portion of the insulating layer so as to cover the first electrode pattern.

The forming of the second electrode pattern may include forming the second electrode pattern by printing conductive ink.

The method may further include wire-bonding the at least one light-emitting device chip to the at least one electrode pad by a metal wire.

The method may further include bonding a plurality of light-emitting device chips on the insulating layer, and wire-bonding the plurality of light-emitting device chips to the at least one electrode pad by a metal wire so that the plurality of light-emitting device chips share the at least one electrode pad.

The forming of the at least one electrode pad may include forming a plurality of n-type electrode pads on the insulating layer, and forming a continuous n-type electrode pattern that connects the plurality of n-type electrode pads to each other.

The forming of the at least one electrode pad may include forming a plurality of p-type electrode pads on the insulating layer, and forming a continuous p-type electrode pattern that connects the plurality of p-type electrode pads to each other.

The method may further include forming a dam surrounding the at least one light-emitting device chip on the insulating layer by using a printing method; and forming a phosphor layer by coating a phosphor inside the dam.

The method may further include forming an optical lens on the phosphor layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
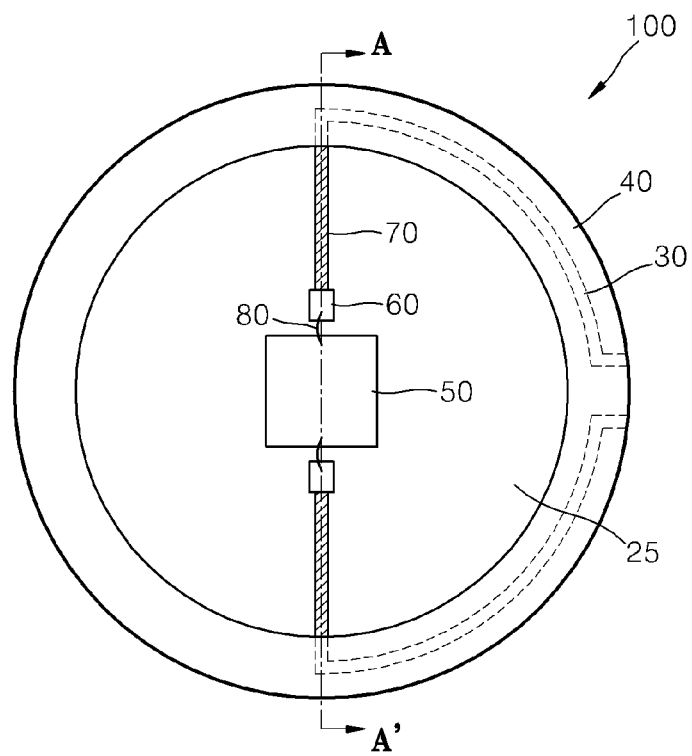
FIG. 1 is a schematic plan view of a light-emitting device package according to an embodiment of the present invention.

Various example embodiments will now be described more fully with reference to the accompanying drawings in which some example embodiments are shown.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

Figure 2:
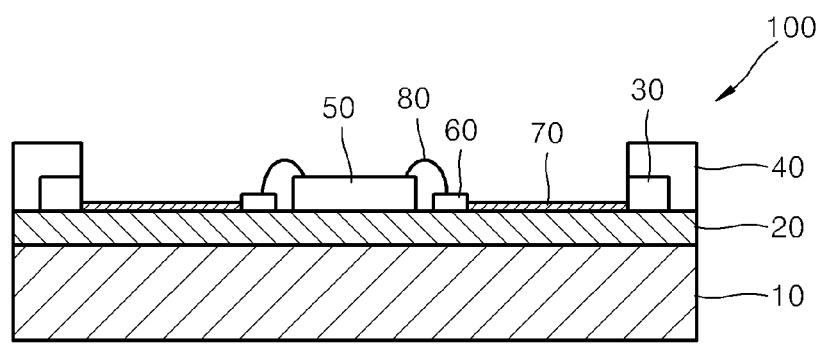
FIG. 2 is a schematic cross-sectional view of the light-emitting device package, taken along a line A-A' of FIG. 1.

FIG. 1 is a schematic plan view of a light-emitting device package 100 according to an embodiment of the present invention. FIG. 2 is a schematic cross-sectional view of the light-emitting device package 100, taken along a line A-A' of FIG. 1.

Referring to FIGS. 1 and 2, the light-emitting device package 100 may include a metal layer 10, an insulating layer 20 disposed on the metal layer 10, a first electrode pattern 30 disposed on an edge portion of the insulating layer 20, a solder mask pattern 40 disposed on an edge portion of the insulating layer 20 and covering the first electrode pattern 30, at least one light-emitting device chip 50 disposed on the insulating layer 20, at least one electrode pad 60 disposed around the light-emitting device chip 50 on the insulating layer 20, and a second electrode pattern 70 disposed on the insulating layer 20 and connecting the first electrode pattern 30 and the electrode pad 60 to each other.

The metal layer 10 may be formed of a metal having high thermal conductivity and reflectivity. For example, the metal layer 10 may be formed of aluminum (Al), copper (Cu), iron (Fe), tungsten (W), silver (Ag), gold (Au), or the like. Although not illustrated in FIGS. 1 and 2, the metal layer 10 may be a core metal of a metal core printed circuit board (MCPCB), and may also be coated by another metal. For example, the metal layer 10 may be formed of Cu, and may be coated by Al, Au, Ag, or the like. In this case, the metal layer 10 may reflect light emitted from the light-emitting device chip 50 and may function as a heat sink.

The insulating layer 20 may be disposed on the metal layer 10 and may be formed of an insulating material such as an epoxy resin. The insulating layer 20 may be formed of a transparent material so as to optically expose the metal layer 10 disposed below the insulating layer 20. Light emitted from the light-emitting device chip 50 may be reflected off the metal layer 10 so as to proceed out of the light-emitting device package 100. The light-emitting device chip 50, the electrode pad 60, the first electrode pattern 30, and the second electrode pattern 70 may be disposed on the insulating layer 20.

The first electrode pattern 30 may be formed at the edge portion of the insulating layer 20. An end of the first electrode pattern 30 may be bent towards a central portion of the insulating layer 20. In order to increase the reflectivity of the light-emitting device package 100, the first electrode pattern 30 may be disposed so as to ensure a maximum reflective region of the metal layer 10. That is, in order to maximize the reflective region of the metal layer 10, the first electrode pattern 30 may be disposed around the edge of the insulating layer 20 at a distance from the edge. The first electrode pattern 30 may be covered by the solder mask pattern 40 and may include an n-type electrode pattern and a p-type electrode pattern. For example, FIG. 1 shows two first electrode patterns 30. One of the first electrode patterns 30 may be an n-type electrode pattern and the other may be a p-type electrode pattern. The first electrode pattern 30 may be an electrode pattern of a MCPCB.

The solder mask pattern 40 may be formed on the insulating layer 20 so as to cover the first electrode pattern 30. That is, the solder mask pattern 40 may be disposed around the edge portion of the insulating layer 20 and cover the first electrode pattern 30 entirely. The solder mask pattern 40 may be formed of a high-molecular compound such as an epoxy resin, or the material of the solder mask pattern 40 may be different from that of the insulating layer 20, Because a typical Chip on Board (COB) type light-emitting device package has no reflective cavity and has a light-emitting device chip surrounded by a solder mask pattern, it is difficult to ensure a reflective region when another structure such as a lens is formed. However, according to the present embodiment, the solder mask pattern 40 is disposed around only the edge portion of the insulating layer 20, and thus, a maximum reflective region of the metal layer 10 may be ensured. Thus, a maximum amount of light emitted from the light-emitting device chip 50 is reflected off the metal layer 10, thereby reducing optical loss of the light-emitting device package 100 and increasing reflectivity and brightness of the light-emitting device package 100. When the first electrode pattern 30 is covered by an optical lens, the solder mask pattern 40 may be omitted.

Figure 3:
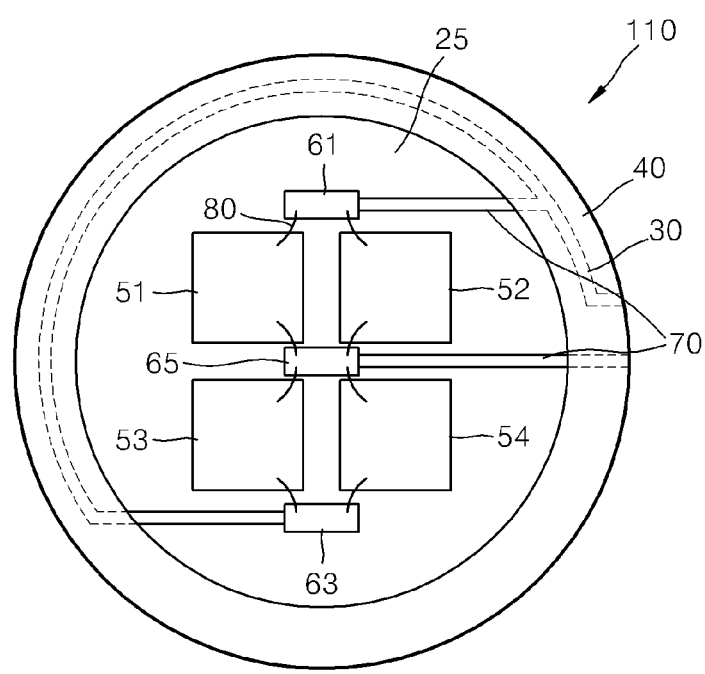
FIG. 3 is a schematic plan view of a light-emitting device package according to another embodiment of the present invention.

The light-emitting device chip 50 is a device in which electrons and holes recombine to emit light in a p-n junction of a compound semiconductor when a current is supplied to the device. The light-emitting device chip 50 may be, for example, a light-emitting diode (LED) chip. The light-emitting device chip 50 may be disposed on the central portion of the insulating layer 20. In FIGS. 1 and 2, one light-emitting device chip 50 is disposed on the insulating layer 20. However, the present invention is not limited there to and a plurality of light-emitting device chips 50 may be disposed on the insulating layer 20. That is, as illustrated in FIG. 3, a plurality of light-emitting device chips 51, 52, 53, and 54 may be disposed on the insulating layer 20. The light-emitting device chip 50 may be disposed on the insulating layer 20 by using a die bonding with adhesives.

The electrode pad 60 may be disposed around the light-emitting device chip 50 on the insulating layer 20. The electrode pad 60 may include an n-type electrode pad and a p-type electrode pad. When a plurality of light-emitting device chips 50 are provided, the n-type electrode pad and the p-type electrode pad may be disposed around each of the light-emitting device chips 50. Also, the n-type electrode pad and the p-type electrode pad may be disposed around an n-type electrode and a p-type electrode of the light-emitting device chip 50 on the insulation layer 20, respectively. In addition, the electrode pad 60 may be electrically connected to the light-emitting device chip 50 through a metal wire 80, and the metal wire 80 may be formed of a conductive material such as Cu, Au, Ag, or the like. When a single electrode is exposed through an upper surface of the light-emitting device chip 50, one electrode pad 60 may be disposed around the single electrode on the insulating layer 20. For example, when the light-emitting device chip 50 has a vertical structure, and a p-type electrode is exposed through the upper surface of the light-emitting device chip 50, the p-type electrode pad may be disposed on the insulating layer 20. In other case, when the n-type electrode is exposed through the upper surface of the light-emitting device chip 50, the n-type pad may be disposed on the insulating layer 20.

The second electrode pattern 70 may be disposed on the insulating layer 20 and may connect the first electrode pattern 30 and the electrode pad 60 to each other. The second electrode pattern 70 may be formed of conductive ink, and the conductive ink may include Cu, Ag, Au, or the like. The second electrode pattern 70 may be formed by printing the conductive ink by using a screen printing method, a flexographic printing method, a gravure printing method, or the like. Thus, the second electrode pattern 70 printed on the insulating layer 20 may be easily and variously deformed according to the size, the number, the arrangement, and the like of the light-emitting device chip 50 disposed on the insulating layer 20.

In a typical COB type light-emitting device package, in order to maximize a reflective region, a metal wire for connecting a light-emitting device chip and an electrode pattern to each other needs to be long. However, when the metal wire is longer, it is more difficult to perform subsequent manufacturing operations, and reliability and optical efficiency may be reduced. However, according to the present embodiment, because the electrode pad 60 is disposed around the light-emitting device chip 50, the light-emitting device chip 50 and the electrode pad 60 may be connected to each other by a shorter metal wire 80, and thus the above-described problem may be overcome.

FIG. 3 is a schematic plan view of a light-emitting device package 110 according to another embodiment of the present invention. The light-emitting device package 110 will be described in terms of its differences from the light-emitting device package 100 of FIGS. 1 and 2. The light-emitting device package 110 may include a plurality of light-emitting device chips, and the light emitting device chips may be arranged in an array.

Referring to FIG. 3, the light-emitting device package 110 may include the light-emitting device chips 51, 52, 53, and 54, and the light emitting device chips 51, 52, 53, and 54 may be arranged in a 2×2 array, for example. The light-emitting device chips 51, 52, 53, and 54 may share electrode pads 61, 63, and 65. Herein, that a plurality of light-emitting device chips share an electrode pads means that the plurality of light-emitting device chips are connected to the same electrode pad together by using a wire bonding method, rather than each of the light-emitting device chips has own electrode pads, for example, and n-type electrode pad and a p-type electrode pad, and is respectively connected to the own electrode pads. According to the present embodiment, the light-emitting device chips 51, 52, 53, and 54 may be disposed on the insulating layer 20, and the electrode pads 61, 63, and 65 may be disposed around the light-emitting device chips 51, 52, 53, and 54. In order for the light-emitting device chips 51, 52, 53, and 54 to share the electrode pads 61, 63, and 65, the electrode pads 61, 63, and 65 may be disposed between the light-emitting device chips 51, 52, 53, and 54. In addition, the electrode pads 61, 63, and 65 may be arranged so as to reduce the length of the metal wire 80 for connecting the light-emitting device chips 51, 52, 53, and 54 and the electrode pads 61, 63, and 65 to each other.

For example, in FIG. 3, four light-emitting device chips 50 are disposed on the insulating layer 20, and two n-type electrode pads 61 and 63, and one p-type electrode pad 65 are shown. Herein, each of the n-type electrode pads 61 and 63 and the p-type electrode pad 65 is connected to the first electrode pattern 30 through the second electrode pattern 70. In this case, the first and second light-emitting device chips 51 and 52 may share the n-type electrode pad 61. That is, the first and second light-emitting device chips 51 and 52 may be bonded to the n-type electrode pad 61 by the metal wire 80. In addition, the third and fourth light-emitting device chips 53 and 54 may share the n-type electrode pad 63. That is, the third and fourth light-emitting device chips 53 and 54 may be bonded to the n-type electrode 63 by the metal wire 80. In addition, the first through fourth light-emitting device chips 51, 52, 53, and 54 may share the p-type electrode pad 65. That is, the first through fourth light-emitting device chips 51, 52, 53, and 54 may be connected to the p-type electrode pad 65 by the metal wire 80. The above method in which electrode pads are shared is an example only, and the electrode pads may be shared by using other methods. According to the present embodiment, because the light-emitting device chips 51, 52, 53, and 54 share the electrode pads 61, 63, and 65, package processes may be simplified and a maximum area of a reflective region of the metal layer 10 may be ensured, compared to a case where the light-emitting device chips 50 include the electrode pads 60, respectively.

Figure 4:
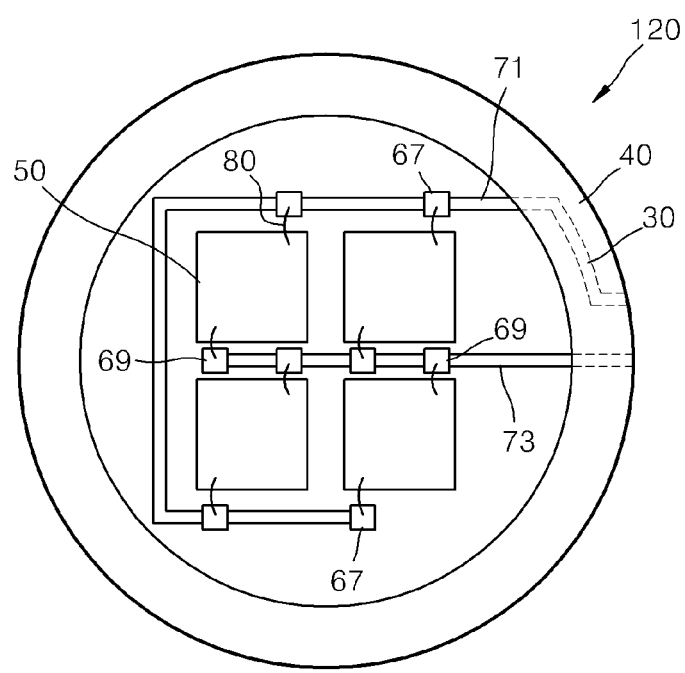
FIG. 4 is a schematic plan view of a light-emitting device package according to another embodiment of the present invention.

FIG. 4 is a schematic plan view of a light-emitting device package 120 according to another embodiment of the present invention. The light-emitting device package 120 will be described in terms of its differences from the light-emitting device packages 100 and 110 of FIGS. 1 through 3.

Referring to FIG. 4, the light-emitting device package 120 may include a plurality of electrode pads 67 and 69. The electrode pads 67 and 69, having the same polarity, may be connected to the first electrode pattern 30 via continuous second electrode patterns 71 and 73, respectively. According to the present embodiment, the light-emitting device chips 50 are disposed on the insulating layer 20, and the electrode pads 67 and 69 are disposed around each of the light-emitting device chips 50. The electrode pads 67 and 69 may include a plurality of n-type electrode pads 67 and a plurality of p-type electrode pads 69. The light-emitting device package 120 may include n-type electrode pads 67 disposed around the light-emitting device chips 50. All the n-type electrode pads 67 are connected to the second electrode pattern 30 by the continuous n-type second electrode pattern 71. For example, four n-type electrode pads 67 disposed around each of the light-emitting device chips 50 are connected to each other and to the first electrode pattern 30 via the continuous n-type second electrode pattern 71. The light-emitting device package 120 may include p-type electrode pads 69 disposed between the light-emitting device chips 50. All the p-type electrode pads 69 may be connected to the first electrode pattern 30 via the continuous p-type second electrode pattern 73. For example, four p-type electrode pads 69 disposed around each of the light-emitting device chips 50 are connected to each other and to the first electrode pattern 3- by the continuous p-type second electrode pattern 73.

Although not illustrated in FIG. 4, some n-type and p-type electrode pads may be shared by the light-emitting device chips 50. That is, the light-emitting device chip 50 may be wire-bonded to a single electrode pad. According to the present embodiment, because the electrode pads 67 and 69 are connected to the first electrode pattern 30 via the continuous n-type second electrode patterns 71 and 73, package processes may be simplified compared to a case where electrode pads are connected to first electrode pattern via own second electrode patterns, respectively.

Figure 5:
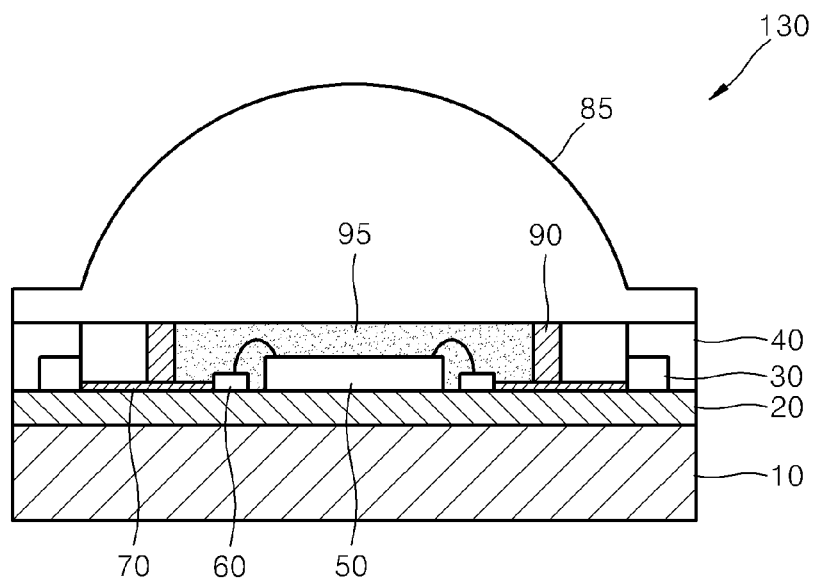
FIG. 5 is a schematic plan view of a light-emitting device package according to another embodiment of the present invention.

FIG. 5 is a schematic plan view of a light-emitting device package 130 according to another embodiment of the present invention. The light-emitting device package 130 will be described in terms of its differences from the light-emitting device packages 100, 110, and 120 of FIGS. 1 through 4.

Referring to FIG. 5, the light-emitting device package 130 may further include a dam 90 surrounding the light-emitting device chip 50. The dam 90 may be disposed on the insulating layer 20, and may surround the light-emitting device chip 50 in order to form a phosphor layer 95 on the light-emitting device chip 50. The dam 90 may be easily formed by using a printing operation, and may be formed to have various shapes according to the size, number, and arrangement of the light-emitting device chips 50. A phosphor may be coated or injected inside the dam 90 so as to form the phosphor layer 95. The phosphor layer 95 may determine properties such as efficiency, lifetime, color rendition, or color reproductivity of the light-emitting device package 130 by controlling properties such as brightness or uniformity of light emitted from the light-emitting device chip 50. The phosphor layer 95 may include at least one phosphor from among a red phosphor, a blue phosphor, and a green phosphor.

The light-emitting device package 130 may further include an optical lens 85 disposed on the phosphor layer 95. The optical lens 85 may converge or diverge light emitted from the light-emitting device chip 50. The size of the optical lens 85 may vary according to the size, number, and arrangement of the light-emitting device chip 50. In addition, optical lenses with various shapes other than a hemispherical shape shown in FIG. 5 may be formed by changing a design of a mold of the optical lens 85.

Hereinafter, a method of manufacturing a light-emitting device package, according to an embodiment of the present invention, will be described in detail.

Figure 6A:
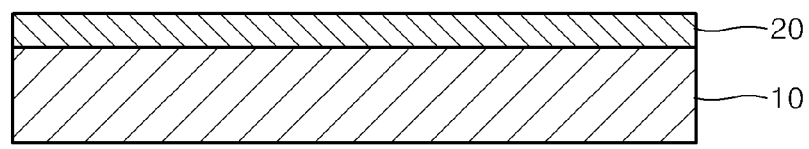
FIGS. 6A through 6D are cross-sectional views for describing a method of manufacturing a light-emitting device package, according to an embodiment of the present invention.

FIGS. 6A through 6D are cross-sectional views for describing a method of manufacturing a light-emitting device package, according to an embodiment of the present invention. Referring to FIG. 6A, the metal layer 10 is prepared. The metal layer 10 may be formed of a metal having high thermal conductivity and reflectivity. For example, the metal layer 10 may be formed of Al, Cu, Fe, W, Ag, Au, or the like. Although not illustrated, the metal layer 10 may be formed of a first metal and may be coated by a second metal. For example, the metal layer 10 may be formed of Cu, and may be coated by Al, Au, Ag, or the like. Then, the insulating layer 20 is formed on the metal layer 10. The insulating layer 20 may be formed by coating an insulating material such as an epoxy resin on the metal layer 10. The insulating layer 20 may be formed of a transparent material so as to optically expose the metal layer 10 disposed below the insulating layer 20.

Figure 6B:
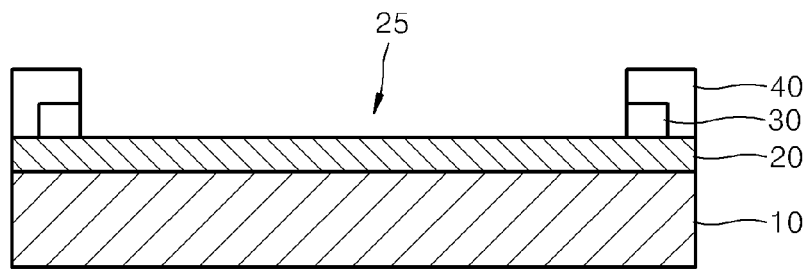

Referring to FIG. 6B, the first electrode pattern 30 may be formed on the insulating layer 20. The insulating layer 20 may be formed so as to optically expose the metal layer 10 disposed below the insulating layer 20 through a central portion of the insulating layer 20. The insulating layer 20 may accommodate the light-emitting device chip 50 and the electrode pad 60 and may reflect light emitted from the light-emitting device chip 50 off the metal layer 10 so as to be emitted out of the light-emitting device package 100. The first electrode pattern 30 may be formed on an edge portion of the insulating layer 20. An end of the first electrode pattern 30 may be bent towards a central portion of the insulating layer 20 so as to be connected to the second electrode pattern 70. In order to increase the reflectivity of the light-emitting device package 100, the first electrode pattern 30 may be disposed so as to ensure a maximum reflective region 25 by the metal layer 10. That is, in order to maximize the reflective region 25, the first electrode pattern 30 may be disposed around the edge of the insulating layer 20 at a distance from the edge.

The first electrode pattern 30 may be covered by a solder mask. That is, the solder mask pattern 40 may be formed on an edge portion of the insulating layer 20 so as to cover the first electrode pattern 30. The solder mask pattern 40 may be formed of a high-molecular compound such as an epoxy resin. Because a typical COB type light-emitting device package has no reflective cavity and has a light-emitting device chip surrounded by a solder mask pattern, it is difficult to ensure a reflective region when another structure such as a lens is formed. However, according to the present embodiment, the solder mask pattern 40 is disposed around only the edge of the insulating layer 20, and thus a maximum reflective region of the metal layer 10 may be ensured. Thus, a maximum amount of light emitted from a light-emitting device chip 50 (see FIG. 6C) is reflected off the metal layer 10, thereby reducing optical loss of the light-emitting device package 100 (see FIG. 6D) and increasing reflectivity and brightness of the light-emitting device package 100. When the first electrode pattern 30 is covered by an optical lens, the forming of the solder mask pattern 40 may be omitted.

Figure 6C:
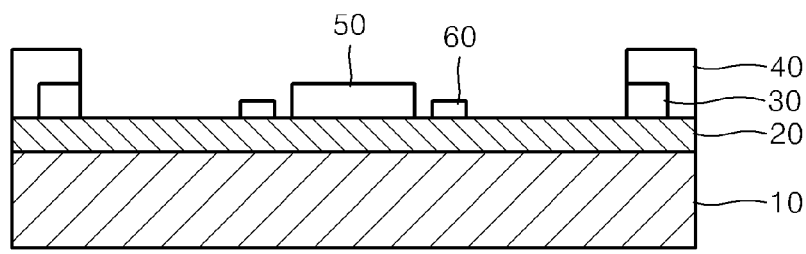

Referring to FIG. 6C, the light-emitting device chip 50 may be bonded onto the insulating layer 20. In FIG. 6C, one light-emitting device chip 50 is bonded onto the insulating layer 20. Alternatively, a plurality of light-emitting device chips 50 may be bonded onto the insulating layer 20. The light-emitting device chip 50 may be disposed on the insulating layer 20 by using a die bonding with adhesives. The electrode pad 60 may be disposed around the light-emitting device chip 50 on the insulating layer 20. In this case, the electrode pad 60 may include an n-type electrode pad and a p-type electrode pad. When a plurality of light-emitting device chips 50 are provided, the n-type electrode pad and the p-type electrode pad may be disposed around each of the light-emitting device chips 50. In addition, when a single electrode is exposed through an upper surface of the light-emitting device chip 50, one electrode pad 60 may be disposed on the insulating layer 20. For example, when the light-emitting device chip 50 has a vertical structure and a p-type electrode is exposed through the upper surface of the light-emitting device chip 50, the p-type electrode pad may be disposed on the insulating layer 20. In other case, when the n-type electrode is exposed through the upper surface of the light-emitting device chip 50, the n-type pad may be disposed on the insulating layer 20.

Figure 6D:
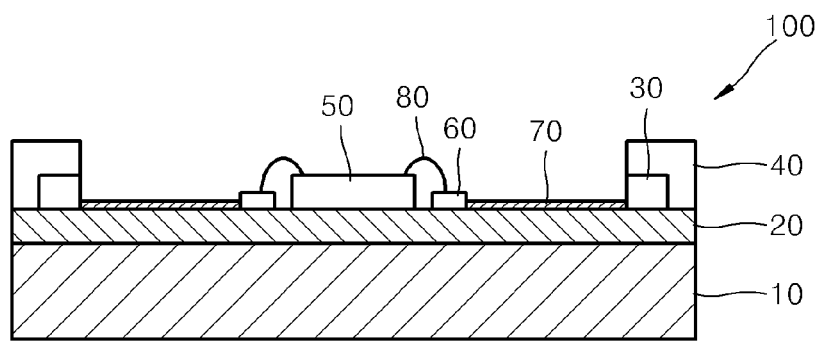

Referring to FIG. 6D, the second electrode pattern 70 may be formed on the insulating layer 20 so as to connect the first electrode pattern 30 and the electrode pad 60 to each other. The second electrode pattern 70 may be formed of conductive ink, and the conductive ink may include a conductive material such as Cu, Ag, Au, or the like, and a polymer binder. The second electrode pattern 70 may be formed by printing the conductive ink by using a screen printing method, a flexographic printing method, a gravure printing method, or the like. Thus, the second electrode pattern 70 may be formed to have various shapes according to the size, number, and arrangement of the light-emitting device chip 50 disposed on the insulating layer 20, and may be easily deformed.

Lastly, the electrode pad 60 and the light-emitting device chip 50 may be wire-bonded by the metal wire 80. In a typical COB type light-emitting device package, in order to maximize a reflective region, a metal wire for connecting a light-emitting device chip and an electrode pattern to each other needs to be long. However, when the metal wire is longer, it is more difficult to perform subsequent manufacturing operations, and reliability and optical efficiency may be reduced. However, according to the present embodiment, since the electrode pad 60 is disposed around the light-emitting device chip 50, the light-emitting device chip 50 and the electrode pad 60 may be connected to each other by a shorter metal wire 80, and thus the above-described problem may be overcome.

The order of the operations included in the above-described method of manufacturing a light-emitting device package may be changed for convenience of processes or for protecting elements. For example, the first and second electrode patterns 30 and 70 may be formed, and then the electrode pad 60 that are connected by the second electrode pattern 70 may be formed.

According to another embodiment of the present invention, in a method of manufacturing a light-emitting device package, wire bonding may be performed so that the light-emitting device chips 51, 52, 53, and 54 may share the electrode pads 61, 63, and 65, as shown in FIG. 3, instead of a method in which at least one electrode pad is formed around light-emitting device chips, respectively. That is, the light-emitting device chips 51, 52, 53, and 54 may be bonded onto the insulating layer 20, and the electrode pads 61, 63, and 65 may be bonded around the light-emitting device chips 51, 52, 53, and 54 so that the light-emitting device chips 51, 52, 53, and 54 may share the electrode pads 61, 63, and 65. In addition, the light-emitting device chips 51, 52, 53, and 54, and the electrode pads 61, 63, and 65 may be wire-bonded to each other by the metal wire 80. According to the present embodiment, since a plurality of light-emitting device chips share electrode pads, package processes may be simplified and a maximum area of a reflective region may be ensured, compared to a case where a plurality light-emitting device chips include their own electrode pads, respectively.

According to another embodiment of the present invention, in a method of manufacturing a light-emitting device package, the electrode pads 67 and 69 are formed around a plurality of light-emitting device chips 50 disposed on the insulating layer 20, as shown in FIG. 4. The electrode pads 67 and 69, having the same polarity, may be connected to the first electrode pattern 30 via the continuous second electrode patterns 71 and 73, respectively. For example, a plurality of n-type electrode pads 67 may be around the light-emitting device chips 50, and the second electrode pattern 71 may be extended continuously so as to connect all the n-type electrode pads 67. A plurality of p-type electrode pads 69 may be formed around the light-emitting device chips 50, and the second electrode pattern 73 for connecting all the p-type electrode pads 69 may be extended continuously. According to the present embodiment, since the electrode pads 67 and 69 are connected to the first electrode pattern 30 via the continuous second electrode pattern 71 and 73, package processes may be simplified compared to a case where electrode pads are connected to first electrode pattern via own second electrode patterns, respectively.

According to another embodiment of the present invention, in a method of manufacturing a light-emitting device package, a dam 90 may be formed so as to surround the light-emitting device chip 50. The dam 90 may be formed on the insulating layer 20 and may be formed to surround the light-emitting device chip 50 in order to form the phosphor layer 95 on the light-emitting device chip 50. The dam 90 may be easily formed by using a printing operation and may be formed to have various shapes according to the size, number, and arrangement of the light-emitting device chips 50. A phosphor may be coated or injected inside the dam 90 so as to form the phosphor layer 95. The phosphor layer 95 may determine properties such as efficiency, lifetime, color rendition, or color reproductivity of the light-emitting device package 130 by controlling properties such as brightness or uniformity of light emitted from the light-emitting device chip 50. The phosphor layer 95 may include at least one phosphor from among a red phosphor, a blue phosphor, and a green phosphor.

According to another embodiment of the present invention, in a method of manufacturing a light-emitting device package, the optical lens 85 may be formed on the phosphor layer 95. The optical lens 85 may be formed by molding a material directly on the phosphor layer 95. Alternatively, the optical lens 85 may be adhered onto the phosphor layer 95. The optical lens 85 may converge or diverge light emitted from the light-emitting device chip 50. The size of the optical lens 85 may vary according to the size, number, and arrangement of the light-emitting device chips 50. In addition, optical lenses with various shapes other than a hemispherical shape shown in FIG. 5 may be formed by changing a design of a mold of the optical lens 85.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A method of manufacturing a light-emitting device package, the method comprising:
   preparing a metal layer;
   forming an insulating layer on the metal layer;
   forming a first electrode pattern on an edge portion of the insulating layer;
   bonding at least one light-emitting device chip on the insulating layer;
   forming at least one electrode pad around the at least one light-emitting device chip such that the at least one electrode pad is electrically separated from the at least one light-emitting device chip and the first electrode pattern; and
   forming a second electrode pattern for connecting the first electrode pattern and the at least one electrode pad to each other on the insulating layer.

2. The method of claim 1, further comprising forming a solder mask pattern on an edge portion of the insulating layer so as to cover the first electrode pattern.

3. The method of claim 1, wherein the forming of the second electrode pattern comprises forming the second electrode pattern by printing conductive ink.

4. The method of claim 1, further comprising wire-bonding the at least one light-emitting device chip to the at least one electrode pad by a metal wire.

5. The method of claim 1, further comprising bonding a plurality of light-emitting device chips on the insulating layer, and
   wire-bonding the plurality of light-emitting device chips to the at least one electrode pad by a metal wire so that the plurality of light-emitting device chips share the at least one electrode pad.

6. The method of claim 1, wherein the forming of the at least one electrode pad comprises forming a plurality of n-type electrode pads on the insulating layer, and forming a continuous n-type electrode patterns that connects the plurality of n-type electrode pads to each other.

7. The method of claim 1, wherein the forming of the at least one electrode pad comprises forming a plurality of p-type electrode pads on the insulating layer, and forming a continuous p-type electrode pattern that connects the plurality of p-type electrode pads to each other.

8. The method of claim 1, further comprising:
   forming a dam surrounding the at least one light-emitting device chip on the insulating layer by using a printing method; and
   forming a phosphor layer by coating a phosphor inside the dam.

9. The method of claim 8, further comprising forming an optical lens on the phosphor layer.

* * * * *